(12) United States Patent
Mumper

(10) Patent No.: US 7,633,754 B1
(45) Date of Patent: Dec. 15, 2009

(54) AIR COOLING SYSTEM FOR AN ELECTRONICS RACK

(75) Inventor: Robert Walters Mumper, Hanover, MD (US)

(73) Assignee: Ciena Corporation, Linthicum, MD (US)

( * ) Notice: Subject to any disclaimer, the term of this patent is extended or adjusted under 35 U.S.C. 154(b) by 0 days.

(21) Appl. No.: 12/199,315

(22) Filed: Aug. 27, 2008

(51) Int. Cl.
H05K 7/20 (2006.01)
(52) U.S. Cl. .................... 361/695; 361/694; 454/184
(58) Field of Classification Search ............ 361/679.48, 361/679.49, 679.51, 688, 689, 694, 695; 454/184
See application file for complete search history.

(56) References Cited

U.S. PATENT DOCUMENTS

| | | | | |
|---|---|---|---|---|
| 3,874,444 | A * | 4/1975 | Perce et al. ................... | 165/47 |
| 4,837,663 | A * | 6/1989 | Zushi et al. ................. | 361/695 |
| 5,136,464 | A * | 8/1992 | Ohmori ....................... | 361/694 |
| 5,995,368 | A * | 11/1999 | Lee et al. .................... | 361/695 |
| 7,126,820 | B2 * | 10/2006 | Wei ............................. | 361/695 |
| 7,184,267 | B2 * | 2/2007 | Patel .......................... | 361/692 |
| 7,259,961 | B2 * | 8/2007 | Lucero et al. ............... | 361/695 |
| 7,420,806 | B1 * | 9/2008 | Lima et al. .................. | 361/695 |
| 7,447,020 | B2 * | 11/2008 | Xia et al. .................... | 361/695 |
| 2005/0078449 | A1 * | 4/2005 | Makooi et al. .............. | 361/695 |
| 2007/0258211 | A1 * | 11/2007 | Sonobe et al. .............. | 361/695 |

* cited by examiner

Primary Examiner—Gregory D Thompson
(74) Attorney, Agent, or Firm—Clements Bernard PLLC; Christopher L. Bernard; Tyler S. Brown

(57) ABSTRACT

The present invention provides an air cooling system for an electronics rack, including: a front inlet area disposed between a lower shelf of the electronics rack and an upper shelf of the electronics rack, substantially adjacent to a middle shelf of the electronics rack, wherein the front inlet area includes a lower front inlet area, a middle front inlet area, and an upper front inlet area; a lower fan assembly disposed substantially adjacent to the lower shelf; and an upper fan assembly disposed substantially adjacent to the upper shelf. The front inlet area, the lower fan assembly, and the upper fan assembly are collectively operable for pulling the cooling air flow into the front of the electronics rack, through the middle shelf, and into a backplane of the electronics rack. The front inlet area, the lower fan assembly, and the upper fan assembly are collectively operable for pulling the cooling air flow into the front of the electronics rack and through the lower shelf and the upper shelf.

18 Claims, 3 Drawing Sheets

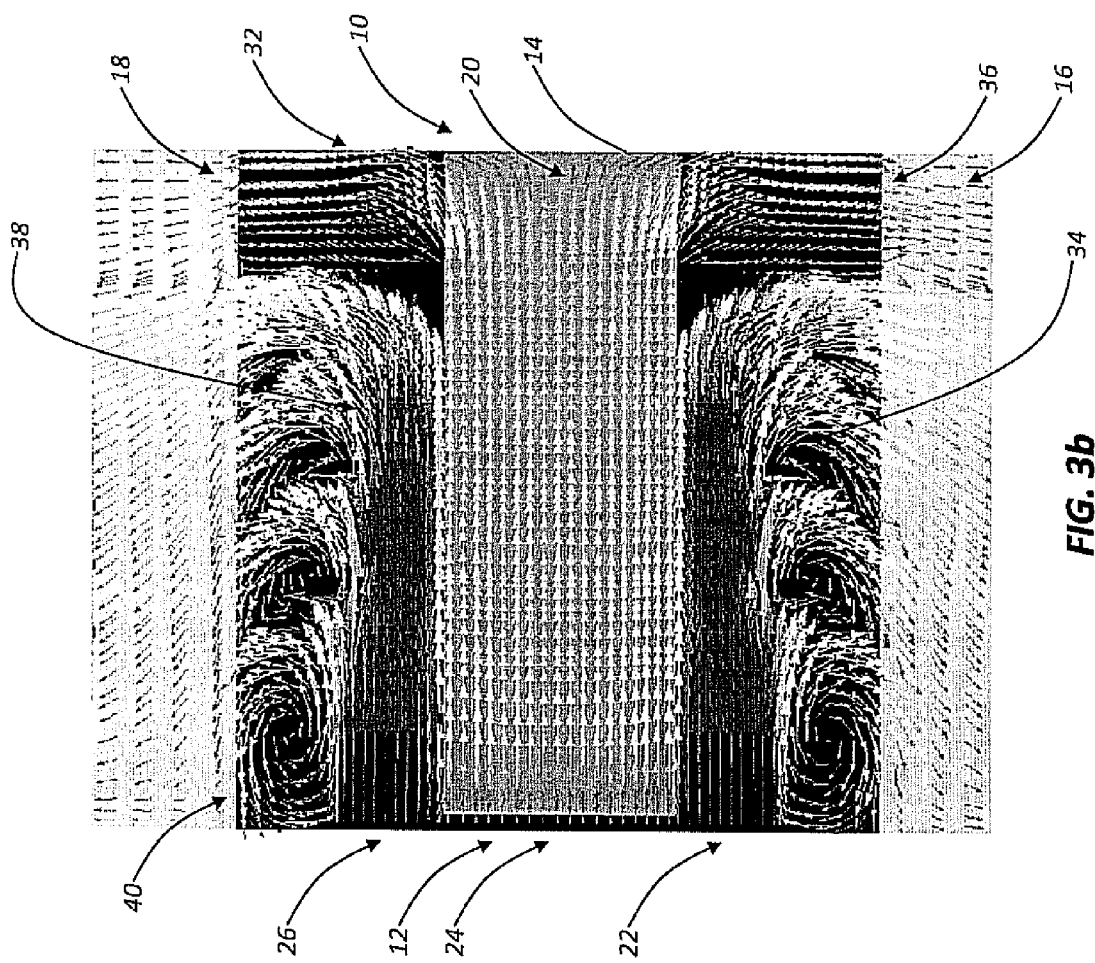
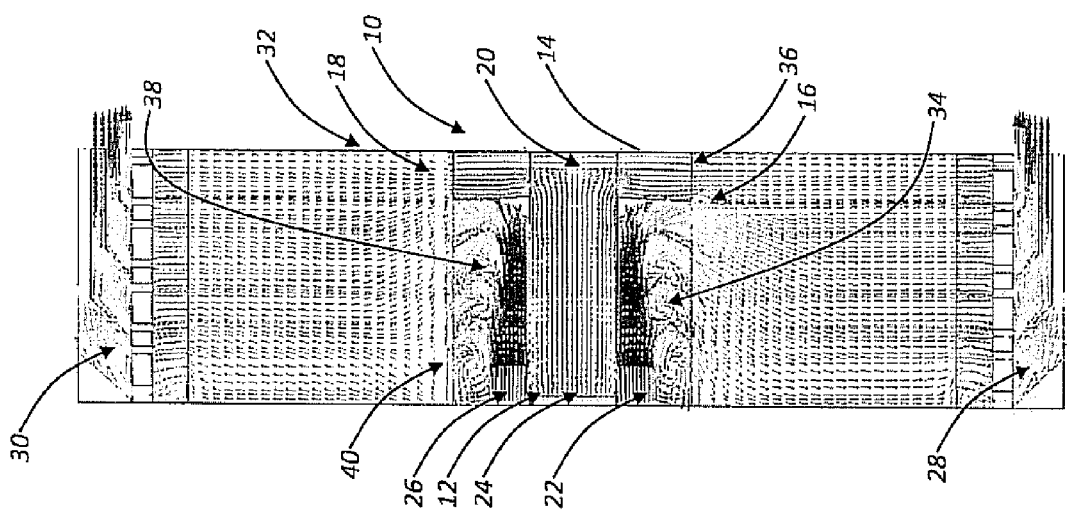
FIG. 3b
FIG. 3a

AIR COOLING SYSTEM FOR AN ELECTRONICS RACK

FIELD OF THE INVENTION

The present invention relates generally to an air cooling system for an electronics rack. More specifically, the present invention relates to an air cooling system for a high-power electronics rack, such as those utilized in optical communications networks and the like.

BACKGROUND OF THE INVENTION

Conventional air cooling systems for electronics racks can be categorized into one of two types—stacked single-shelf systems and full-rack systems. The stacked single-shelf systems are typically in either a bottom-to-top, front-to-back, or side-to-side air flow configuration. The shelves are stacked in the electronics rack, with each individual shelf, as well as their combined effect, creating an air cooling system for the electronics rack. The full-rack systems are typically in a bottom-to-top, or chimney, air flow configuration. Both types of conventional air cooling systems suffer from significant limitations.

The bottom-to-top air flow configuration stacked single-shelf systems require vertical space in the electronics rack below and above each shelf for air intake and exhaust plenums. This limits the space available for electronics. The front-to-back air flow configuration stacked single-shelf systems utilize an air intake area that limits the electronics module faceplate room available for front connectivity and an air exhaust area that limits the backplane available for back connectivity. The side-to-side air flow configuration stacked single-shelf systems utilize air intake and exhaust areas that are often blocked by the electronics rack structure and air intake and exhaust volumes that detract from the available volume in the shelf for electronics. The bottom-to-top, or chimney, air flow configuration full-rack systems suffer from the limitation that the preheating of the air stream entering the upper shelves in the electronics rack due to heat dissipation in the lower shelves of the electronics rack limits the amount of power that can be utilized in the upper-shelf electronics.

Thus, what is still needed in the art is an air cooling system for an electronics rack that overcomes these limitations.

BRIEF SUMMARY OF THE INVENTION

The present invention provides an air cooling system for an electronics rack that is used most advantageously when the associated electronics are high power, meaning that there is a significant amount of heat dissipation in each shelf; the backplane is continuous from the bottom of the bottom shelf in the electronics rack to the top of the top shelf in the electronics rack and there are no openings for air flow; there are more than two shelves in the electronics rack (a three-shelf electronics rack is illustrated and described herein, however, the air cooling system design of the present invention is extendable to electronics racks having more than three shelves); the overall vertical space in the electronics rack is highly constrained and electronics volume is at a premium; the number of slots in the shelf available for electronics (i.e. the shelf width) is at a premium; the electronics have dense front connectivity; the electronics have dense backplane connectivity; and the electronics rack has significant structure.

The bottom-to-top air flow configuration stacked single-shelf systems are not compatible with the backplane being continuous from the bottom of the bottom shelf in the electronics rack to the top of the top shelf in the electronics rack and there being no openings for air flow, or with the overall vertical space in the electronics rack being highly constrained and electronics volume being at a premium. The front-to-back air flow configuration stacked single-shelf systems are not compatible with the backplane being continuous from the bottom of the bottom shelf in the electronics rack to the top of the top shelf in the electronics rack and there being no openings for air flow, the electronics having dense front connectivity, or the electronics having dense backplane connectivity. The side-to-side air flow configuration stacked single-shelf systems are not compatible with the number of slots in the shelf available for electronics (i.e. the shelf width) being at a premium, or the electronics rack having significant structure. The bottom-to-top and chimney air flow configuration full-rack systems are not compatible with the electronics being high power, meaning that there is a significant amount of heat dissipation in each shelf, or there being more than two shelves in the electronics rack.

The present invention provides an air cooling system for an electronics rack, including: a front inlet area disposed between a lower shelf of the electronics rack and an upper shelf of the electronics rack, substantially adjacent to a middle shelf of the electronics rack, wherein the front inlet area includes a lower front inlet area, a middle front inlet area, and an upper front inlet area, and wherein the front inlet area permits a cooling air flow to enter the electronics rack; a lower fan assembly disposed substantially adjacent to the lower shelf opposite the middle shelf, and an upper fan assembly disposed substantially adjacent to the upper shelf opposite the middle shelf; wherein the front inlet area, the lower fan assembly, and the upper fan assembly are collectively operable for pulling the cooling air flow into the front of the electronics rack, through the middle shelf, and to a backplane of the electronics rack, where the cooling air flow is split and diverted both down and up along the backplane, at a rear portion of the lower shelf and the upper shelf; and wherein the front inlet area, the lower fan assembly, and the upper fan assembly are collectively operable for pulling the cooling air flow into the front of the electronics rack and through the lower shelf and the upper shelf. The air cooling system also includes a lower vent that separates the lower shelf from the middle shelf. The air cooling system further includes a lower set of baffles disposed adjacent to the lower vent. The air cooling system still further includes an upper vent that separates the upper shelf from the middle shelf. The air cooling system still further includes an upper set of baffles disposed adjacent to the upper vent. The air cooling system still further includes one or more vent covers associated with the front inlet area.

The present invention also provides a method for cooling an electronics rack, including: providing a front inlet area disposed between a lower shelf of the electronics rack and an upper shelf of the electronics rack, substantially adjacent to a middle shelf of the electronics rack, wherein the front inlet area includes a lower front inlet area, a middle front inlet area, and an upper front inlet area, and wherein the front inlet area permits a cooling air flow to enter the electronics rack; providing a lower fan assembly disposed substantially adjacent to the lower shelf opposite the middle shelf; and providing an upper fan assembly disposed substantially adjacent to the upper shelf opposite the middle shelf; wherein the front inlet area, the lower fan assembly, and the upper fan assembly are collectively operable for pulling the cooling air flow into the front of the electronics rack, through the middle shelf, and to a backplane of the electronics rack, where the cooling air flow is split and diverted both down and up along the backplane, at a rear portion of the lower shelf and the upper shelf; and wherein the front inlet area, the lower fan assembly, and the upper fan assembly are collectively operable for pulling the cooling air flow into the front of the electronics rack and through the lower shelf and the upper shelf. The air cooling method also includes providing a lower vent that separates the lower shelf from the middle shelf. The air cooling method further includes providing a lower set of baffles disposed adjacent to the lower vent. The air cooling method still further includes providing an upper vent that separates the upper shelf from the middle shelf. The air cooling method still further includes providing an upper set of baffles disposed adjacent to the upper vent. The air cooling method still further includes providing one or more vent covers associated with the front inlet area.

The present invention further provides a method for cooling an electronics rack, including: providing a first cooling air flow conduit associated with a middle shelf and a backplane of the electronics rack; providing a second cooling air flow conduit associated with a lower shelf of the electronics rack; providing a third cooling air flow conduit associated with an upper shelf of the electronics rack; disposing a lower fan assembly substantially adjacent to the lower shelf opposite the middle shelf; and disposing an upper fan assembly substantially adjacent to the upper shelf opposite the middle shelf; wherein the first cooling air flow conduit, the lower fan assembly, and the upper fan assembly are collectively operable for pulling a cooling air flow into the front of the electronics rack, through the middle shelf, and to the backplane of the electronics rack, where the cooling air flow is split and diverted both down and up along the backplane, at a rear portion of the lower shelf and the upper shelf; and wherein the second cooling air flow conduit, the third cooling air flow conduit, the lower fan assembly, and the upper fan assembly are collectively operable for pulling the cooling air flow into the front of the electronics rack and through the lower shelf and the upper shelf. The air cooling method also includes providing a lower vent that separates the lower shelf from the middle shelf. The air cooling method further includes providing a lower set of baffles disposed adjacent to the lower vent. The air cooling method still further includes providing an upper vent that separates the upper shelf from the middle shelf. The air cooling method still further includes providing an upper set of baffles disposed adjacent to the upper vent. The air cooling method still further includes providing one or more vent covers associated with the first cooling air flow conduit, the second cooling air flow conduit, and the third cooling air flow conduit.

BRIEF DESCRIPTION OF THE DRAWINGS

The present invention is illustrated and described herein with reference to the various drawings, in which like reference numbers are used to denote like system components/method steps, as appropriate, and in which:

FIG. 3 is a series of air flow diagrams illustrating the transfer of heat associated with the air cooling system for a high-power electronics rack of FIGS. 1 and 2.

DETAILED DESCRIPTION OF THE INVENTION

The present invention generally provides an air cooling system for an electronics rack that is used most advantageously when the associated electronics are high power, meaning that there is a significant amount of heat dissipation in each shelf; the backplane is continuous from the bottom of the bottom shelf in the electronics rack to the top of the top shelf in the electronics rack and there are no openings for air flow; there are more than two shelves in the electronics rack (a three-shelf electronics rack is illustrated and described herein, however, the air cooling system design of the present invention is extendable to electronics racks having more than three shelves); the overall vertical space in the electronics rack is highly constrained and electronics volume is at a premium; the number of slots in the shelf available for electronics (i.e. the shelf width) is at a premium; the electronics have dense front connectivity; the electronics have dense backplane connectivity; and the electronics rack has significant structure.

The bottom-to-top air flow configuration stacked single-shelf systems are not compatible with the backplane being continuous from the bottom of the bottom shelf in the electronics rack to the top of the top shelf in the electronics rack and there being no openings for air flow, or with the overall vertical space in the electronics rack being highly constrained and electronics volume being at a premium. The front-to-back air flow configuration stacked single-shelf systems are not compatible with the backplane being continuous from the bottom of the bottom shelf in the electronics rack to the top of the top shelf in the electronics rack and there being no openings for air flow, the electronics having dense front connectivity, or the electronics having dense backplane connectivity. The side-to-side air flow configuration stacked single-shelf systems are not compatible with the number of slots in the shelf available for electronics (i.e. the shelf width) being at a premium, or the electronics rack having significant structure. The bottom-to-top and chimney air flow configuration full-rack systems are not compatible with the electronics being high power, meaning that there is a significant amount of heat dissipation in each shelf, or there being more than two shelves in the electronics rack.

Figure 1:
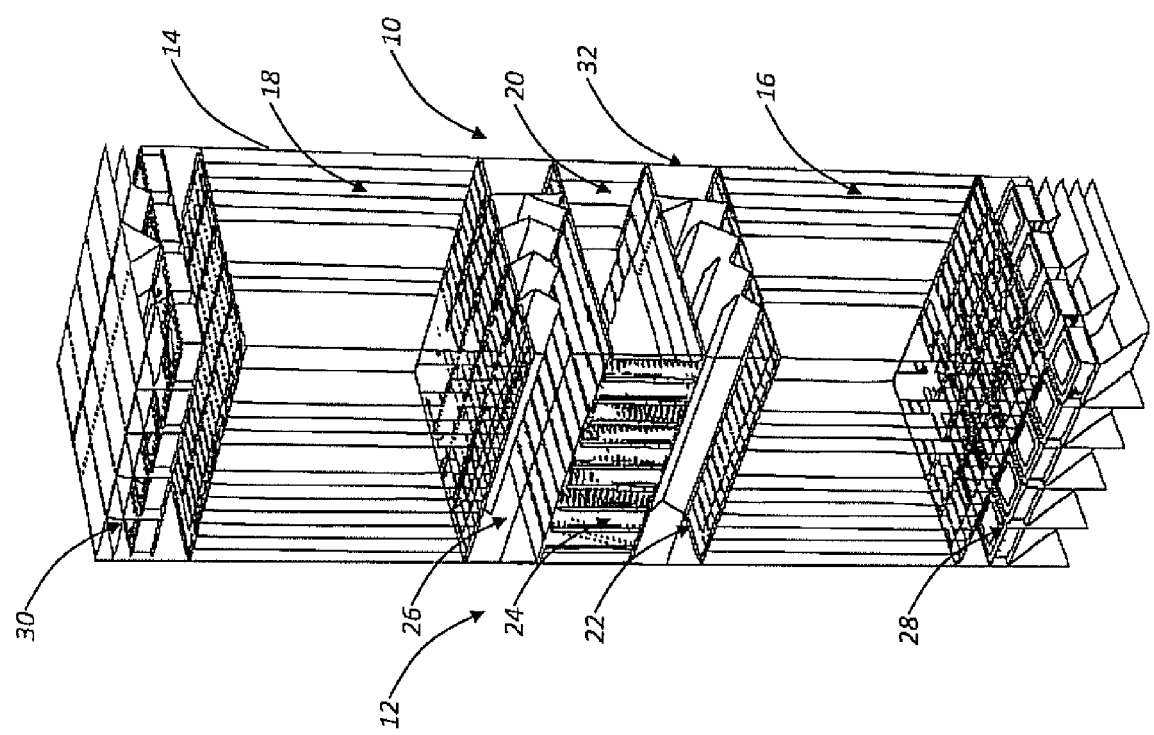
FIG. 1 is a schematic diagram illustrating one exemplary embodiment of the air cooling system for a high-power electronics rack of the present invention.

Referring to FIG. 1, the air cooling system 10 of the present invention includes a front inlet area 12 through which a cooling air flow is permitted to enter the electronics rack housing 14. This front inlet area 12 is disposed between a lower shelf 16 and an upper shelf 18, substantially adjacent to a middle shelf 20, for example. It will be readily apparent to those of ordinary skill in the art that additional shelves could also be utilized. The front inlet area 12 includes a lower front inlet area 22, a middle front inlet area 24, and an upper front inlet area 26. The air cooling system 10 also includes a lower fan assembly 28 disposed substantially adjacent to the lower shelf 16 opposite the middle shelf 20 and an upper fan assembly 30 disposed substantially adjacent to the upper shelf 18 also opposite the middle shelf 20.

The middle front inlet area 24, the lower fan assembly 28, and the upper fan assembly 30 are collectively operable for pulling the cooling air flow into the front of the electronics rack housing 14, through the middle shelf 20, and to the backplane 32 of the electronics rack, where the cooling air flow is split and diverted both down and up along the backplane, at the rear portion of the lower shelf 16 and the upper shelf 18, until the cooling air flow is exhausted through the lower fan assembly 28 and the upper fan assembly 30. Simultaneously, the lower front inlet area 22 and the lower fan assembly 28 and the upper front inlet area 26 and the upper fan assembly 30 are collectively operable for pulling the cooling air flow into the front of the electronics rack housing 14 and through the lower shelf 16 and the upper shelf 18, until the cooling air flow is exhausted through the lower fan assembly 28 and the upper fan assembly 30.

Figure 2:
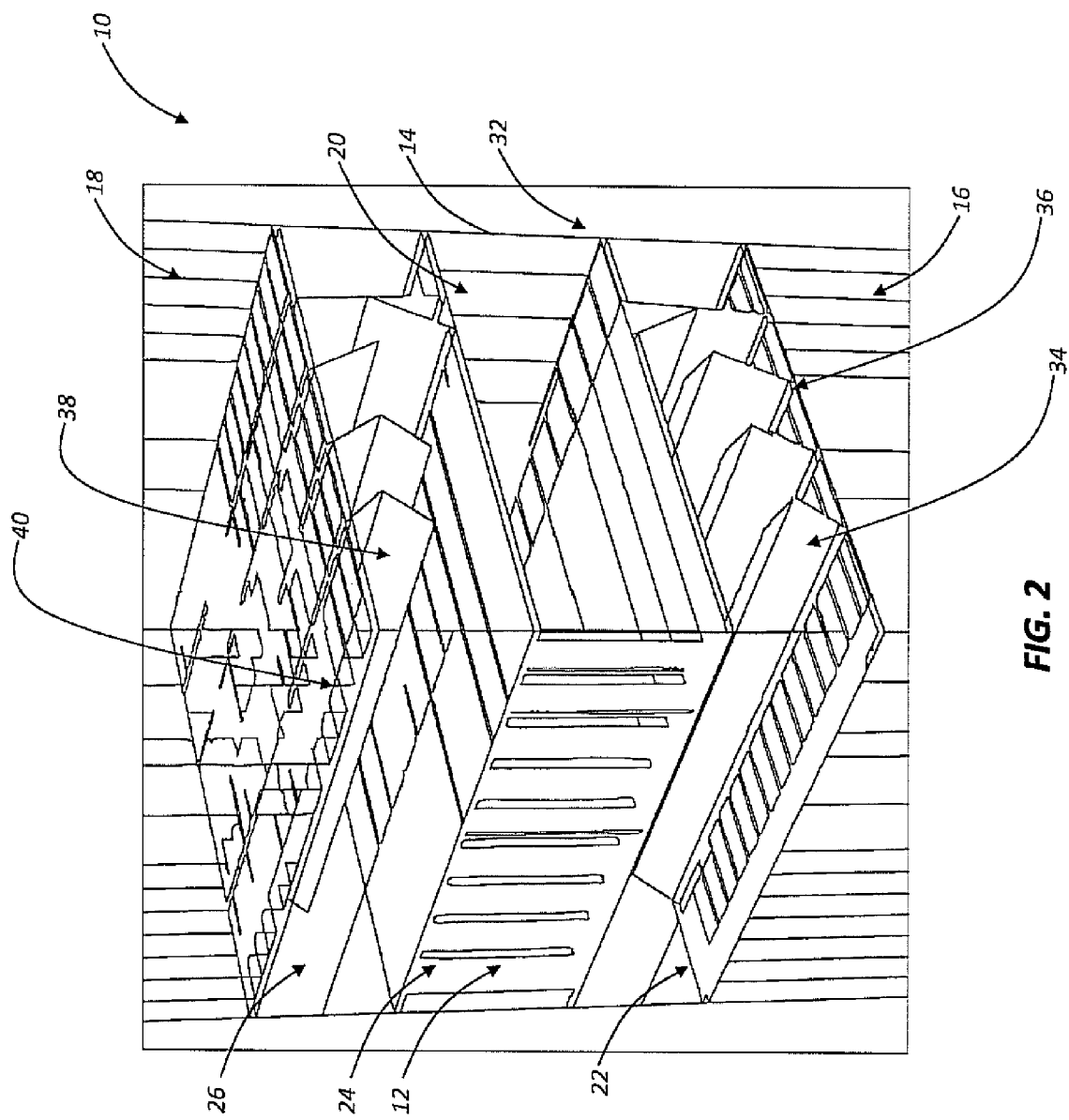
FIG. 2 is a partial schematic diagram illustrating the air cooling system for a high-power electronics rack of FIG. 1.

Referring to FIG. 2, it can be seen that the lower front inlet area 22, the middle front inlet area 24, and the upper front inlet area 26 include a series of non-communicating cooling air flow conduits that are arranged in a stacked configuration. The lower front inlet area 22, the middle front inlet area 24, and the upper front inlet area 26 are configured and positioned to provide the cooling air flow to the lower portion of the middle shelf 20 and the front portion of the lower shelf 16, the middle shelf 20, and the upper portion of the middle shelf 20 and the front portion of the upper shelf 18, respectively. Each portion of the front inlet area 12 includes various vent covers or the like that are suitable to prevent the intrusion of things other than the cooling air flow into the electronics rack housing 14. In order to efficiently distribute and circulate the cooling air flow, the lower front inlet area 22 includes a lower set of baffles 34 disposed adjacent to a lower vent 36 that separates the lower shelf volume from the lower inlet volume and middle shelf volume and the upper front inlet area 26 includes an upper set of baffles 38 disposed adjacent to an upper vent 40 that separates the upper inlet volume and the middle shelf volume from the upper shelf volume. Any suitable baffling arrangement can be utilized, depending upon the cooling air flow distribution and circulation desired.

Referring to FIGS. 3a and 3b, it can again be seen that the lower front inlet area 22, the middle front inlet area 24, and the upper front inlet area 26 are configured and positioned to provide the cooling air flow to the front portion of the lower shelf 16, the middle shelf 20, and the front portion of the upper shelf 18, respectively, as indicated by the arrows denoting the cooling air flow. Each portion of the front inlet area 12 includes various vent covers or the like that are suitable to prevent the intrusion of things other than the cooling air flow into the electronics rack housing 14. In order to efficiently distribute and circulate the cooling air flow, the lower front inlet area 22 includes a lower set of baffles 34 disposed adjacent to a lower vent 36 that separates the lower shelf volume from the lower inlet volume and middle shelf volume and the upper front inlet area 26 includes an upper set of baffles 38 disposed adjacent to an upper vent 40 that separates the upper inlet volume and the middle shelf volume from the upper shelf volume. Again, any suitable baffling arrangement can be utilized, depending upon the cooling air flow distribution and circulation desired.

Referring specifically to FIG. 3a, again, the middle front inlet area 24, the lower fan assembly 28, and the upper fan assembly 30 are collectively operable for pulling the cooling air flow into the front of the electronics rack housing 14, through the middle shelf 20, and to the backplane 32 of the electronics rack, where the cooling air flow is split and diverted both down and up along the backplane, at the rear portion of the lower shelf 16 and the upper shelf 18, until the cooling air flow is exhausted through the lower fan assembly 28 and the upper fan assembly 30, as indicated by the arrows denoting the cooling air flow. Simultaneously, the lower front inlet area 22 and the lower fan assembly 28 and the upper front inlet area 26 and the upper fan assembly 30 are collectively operable for pulling the cooling air flow into the front of the electronics rack housing 14 and through the lower shelf 16 and the upper shelf 18, until the cooling air flow is exhausted through the lower fan assembly 28 and the upper fan assembly 30, as indicated by the arrows denoting the cooling air flow.

Although the present invention has been illustrated and described herein with reference to preferred embodiments and specific examples thereof, it will be readily apparent to those of ordinary skill in the art that other embodiments and examples can perform similar functions and/or achieve like results as it relates to the cooling of the electronic components of a shelf or non-shelf-based, high-power electronics rack or the like, such as those utilized in optical communications networks and the like. All such equivalent embodiments and examples are within the spirit and scope of the present invention, are contemplated thereby, and are intended to be covered by the following claims.

What is claimed is:

1. An air cooling system for an electronics rack, comprising:
    a front inlet area disposed between a lower shelf of the electronics rack and an upper shelf of the electronics rack, substantially adjacent to a middle shelf of the electronics rack, wherein the front inlet area comprises a lower front inlet area, a middle front inlet area, and an upper front inlet area, and wherein the front inlet area permits a cooling air flow to enter the electronics rack;
    a lower fan assembly disposed substantially adjacent to the lower shelf opposite the middle shelf; and
    an upper fan assembly disposed substantially adjacent to the upper shelf opposite the middle shelf;
    wherein the front inlet area, the lower fan assembly, and the upper fan assembly are collectively operable for pulling the cooling air flow into the front of the electronics rack, through the middle shelf, and to a backplane of the electronics rack, where the cooling air flow is split and diverted both down and up along the backplane, at a rear portion of the lower shelf and the upper shelf; and
    wherein the front inlet area, the lower fan assembly, and the upper fan assembly are collectively operable for pulling the cooling air flow into the front of the electronics rack and through the lower shelf and the upper shelf.

2. The air cooling system of claim 1, further comprising a lower vent that separates the lower shelf from the middle shelf.

3. The air cooling system of claim 2, further comprising a lower set of baffles disposed adjacent to the lower vent.

4. The air cooling system of claim 1, further comprising an upper vent that separates the upper shelf from the middle shelf.

5. The air cooling system of claim 4, further comprising an upper set of baffles disposed adjacent to the upper vent.

6. The air cooling system of claim 1, further comprising one or more vent covers associated with the front inlet area.

7. A method for cooling an electronics rack, comprising:
    providing a front inlet area disposed between a lower shelf of the electronics rack and an upper shelf of the electronics rack, substantially adjacent to a middle shelf of the electronics rack, wherein the front inlet area comprises a lower front inlet area, a middle front inlet area, and an upper front inlet area, and wherein the front inlet area permits a cooling air flow to enter the electronics rack;
    providing a lower fan assembly disposed substantially adjacent to the lower shelf opposite the middle shelf; and
    providing an upper fan assembly disposed substantially adjacent to the upper shelf opposite the middle shelf;
    wherein the front inlet area, the lower fan assembly, and the upper fan assembly are collectively operable for pulling the cooling air flow into the front of the electronics rack, through the middle shelf, and to a backplane of the electronics rack, where the cooling air flow is split and diverted both down and up along the backplane, at a rear portion of the lower shelf and the upper shelf; and wherein the front inlet area, the lower fan assembly, and the upper fan assembly are collectively operable for pulling the cooling air flow into the front of the electronics rack and through the lower shelf and the upper shelf.

8. The air cooling method of claim 7, further comprising providing a lower vent that separates the lower shelf from the middle shelf.

9. The air cooling method of claim 8, further comprising providing a lower set of baffles disposed adjacent to the lower vent.

10. The air cooling method of claim 7, further comprising providing an upper vent that separates the upper shelf from the middle shelf.

11. The air cooling method of claim 10, further comprising providing an upper set of baffles disposed adjacent to the upper vent.

12. The air cooling method of claim 7, further comprising providing one or more vent covers associated with the front inlet area.

13. A method for cooling an electronics rack, comprising:
providing a first cooling air flow conduit associated with a middle shelf and a backplane of the electronics rack;
providing a second cooling air flow conduit associated with a lower shelf of the electronics rack;
providing a third cooling air flow conduit associated with an upper shelf of the electronics rack;
disposing a lower fan assembly substantially adjacent to the lower shelf opposite the middle shelf; and
disposing an upper fan assembly substantially adjacent to the upper shelf opposite the middle shelf;
wherein the first cooling air flow conduit, the lower fan assembly, and the upper fan assembly are collectively operable for pulling a cooling air flow into the front of the electronics rack, through the middle shelf, and to the backplane of the electronics rack, where the cooling air flow is split and diverted both down and up along the backplane, at a rear portion of the lower shelf and the upper shelf; and
wherein the second cooling air flow conduit, the third cooling air flow conduit, the lower fan assembly, and the upper fan assembly are collectively operable for pulling the cooling air flow into the front of the electronics rack and through the lower shelf and the upper shelf.

14. The air cooling method of claim 13, further comprising providing a lower vent that separates the lower shelf from the middle shelf.

15. The air cooling method of claim 14, further comprising providing a lower set of baffles disposed adjacent to the lower vent.

16. The air cooling method of claim 13, further comprising providing an upper vent that separates the upper shelf from the middle shelf.

17. The air cooling method of claim 16, further comprising providing an upper set of baffles disposed adjacent to the upper vent.

18. The air cooling method of claim 13, further comprising providing one or more vent covers associated with the first cooling air flow conduit, the second cooling air flow conduit, and the third cooling air flow conduit.

* * * * *